(12) United States Patent
Truong et al.

(10) Patent No.: US 8,619,326 B2
(45) Date of Patent: Dec. 31, 2013

(54) MULTICOLOR ELECTRONIC DEVICES AND PROCESSES OF FORMING THE SAME BY PRINTING

(75) Inventors: Nugent Truong, Ventura, CA (US); Matthew Stainer, Goleta, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 106 days.

(21) Appl. No.: 13/318,563

(22) PCT Filed: Jun. 3, 2010

(86) PCT No.: PCT/US2010/037247
§ 371 (c)(1),
(2), (4) Date: Nov. 2, 2011

(87) PCT Pub. No.: WO2010/141713
PCT Pub. Date: Dec. 9, 2010

(65) Prior Publication Data
US 2012/0044512 A1  Feb. 23, 2012

Related U.S. Application Data

(60) Provisional application No. 61/184,086, filed on Jun. 4, 2009.

(51) Int. Cl.
*H04N 1/60* (2006.01)

(52) U.S. Cl.
USPC ............ 358/1.9; 358/518; 358/530; 427/162; 427/165; 427/166; 347/12; 347/15; 347/19; 347/40; 347/41

(58) Field of Classification Search
None
See application file for complete search history.

(56) References Cited

U.S. PATENT DOCUMENTS

| | | | |
|---|---|---|---|
| 5,592,202 A | 1/1997 | Erickson | |
| 6,582,048 B1 * | 6/2003 | Akahira et al. | 347/19 |

(Continued)

FOREIGN PATENT DOCUMENTS

| | | |
|---|---|---|
| CN | 1605465 A | 4/2005 |
| CN | 1994739 A | 7/2007 |

(Continued)

OTHER PUBLICATIONS

ISR 20090206; PCT International Search Report for Application No. PCT/US2008/086150; Young, Lee W., Authorized Officer; Feb. 6, 2009.

(Continued)

*Primary Examiner* — Dung Tran

(57) ABSTRACT

Disclosed is process of forming a regular array of rows of subpixels on a workpiece. The subpixels having four different colors, and a subpixel pitch s. Of the four colors, q colors are formed by printing and r colors are formed by a non-printing method. The process includes the steps: (1) providing a printing head having z nozzles arranged in a row with a spacing between the nozzles of p, where $z=4n_1$ and $p=3s$, the printing head being at a first position relative to the workpiece; (2) providing q different printing inks, one for each of the q printed colors; (3) supplying each of the printing inks to the nozzles in a regular alternating pattern; (4) printing a first set of z rows of subpixels with the printing head; (5) moving and printing in a first printing pattern by: (a) moving the workpiece laterally relative to the printing head by a distance $d_1$, where $d_1=4n_2s$; (b) printing a set of z rows of subpixels with the printing head; (6) moving and printing in a second printing pattern by: (c) moving the workpiece laterally relative to the printing head by a distance $d_2$, where $d_2=d_1$; (d) printing a set of z rows of subpixels with the printing head; (7) moving and printing in a third printing pattern by: (e) moving the workpiece laterally relative to the printing head by a distance $d_3$, where $d_3=4n_3s$, such that $d_1+d_2+d_3=pz$; and (f) printing a set of z rows of subpixels with the printing head; (8) repeating steps (5) through (7) multiple times in the same order; and (9) applying r colors by a non-printing method.

7 Claims, 12 Drawing Sheets

(56) References Cited

U.S. PATENT DOCUMENTS

| | | | |
|---|---|---|---|
| 6,655,783 B2 | 12/2003 | Otsuki | |
| 6,670,645 B2 | 12/2003 | Grushin et al. | |
| 6,758,550 B2* | 7/2004 | Ito et al. | 347/40 |
| 7,067,170 B2* | 6/2006 | Marcus et al. | 427/66 |
| 7,188,919 B2* | 3/2007 | Satomura | 347/12 |
| 7,296,868 B2 | 11/2007 | Shibata et al. | |
| 7,381,444 B2* | 6/2008 | Shigemura et al. | 427/162 |
| 7,459,177 B2* | 12/2008 | Kimura et al. | 427/162 |
| 7,854,960 B2* | 12/2010 | Umehara et al. | 427/58 |
| 2003/0108804 A1* | 6/2003 | Cheng et al. | 430/7 |
| 2003/0129321 A1* | 7/2003 | Aoki | 427/458 |
| 2006/0228469 A1* | 10/2006 | Shigemura et al. | 427/162 |
| 2006/0290732 A1* | 12/2006 | Park et al. | 347/15 |
| 2007/0188548 A1* | 8/2007 | Kwon et al. | 347/40 |
| 2007/0190233 A1* | 8/2007 | Chung | 427/58 |
| 2007/0296796 A1* | 12/2007 | Lee et al. | 347/107 |
| 2008/0024552 A1* | 1/2008 | White et al. | 347/41 |
| 2008/0067924 A1 | 3/2008 | Prakash et al. | |
| 2008/0157659 A1 | 7/2008 | Prakash | |
| 2009/0004376 A1* | 1/2009 | Lee | 427/168 |
| 2010/0279081 A1* | 11/2010 | Koele et al. | 428/195.1 |
| 2011/0181899 A1 | 7/2011 | Stainer et al. | |
| 2011/0298863 A1 | 12/2011 | Truong et al. | |
| 2012/0045568 A1 | 2/2012 | Truong et al. | |

FOREIGN PATENT DOCUMENTS

| | | | |
|---|---|---|---|
| JP | 08300694 A | 11/1996 | |
| JP | 09138306 A | 5/1997 | |
| JP | 11048503 A | 2/1999 | |
| JP | 2001185355 A | 7/2001 | |
| JP | 2003117460 A | 4/2003 | |
| JP | 2004358314 A | 12/2004 | |
| JP | 2005087801 A | 4/2005 | |
| JP | 2007256312 A | 10/2007 | |
| JP | 2008197149 A | 8/2008 | |
| KR | 1020060064784 A | 6/2006 | |
| KR | 100759838 B1 | 9/2007 | |
| WO | 03008424 A1 | 1/2003 | |
| WO | 03040257 A1 | 5/2003 | |
| WO | 03063555 A1 | 7/2003 | |
| WO | 03091688 A2 | 11/2003 | |
| WO | 2004016710 A1 | 2/2004 | |
| WO | 2007145979 A2 | 12/2007 | |

OTHER PUBLICATIONS

ISR 20100525; PCT International Search Report for Application No. PCT/US2009/06140; Kim, Ju Seung, Authorized Officer; May 25, 2010.

ISR 20101015; PCT International Search Report for Application No. PCT/US2010/026469; Han, Man Yeol, Authorized Officer; Oct. 15, 2010.

ISR 20101213; PCT International Search Report for Application No. PCT/US2010/037231; Kim, Chang Gyun, Authorized Officer; Dec. 13, 2010.

ISR 20101213; PCT International Search Report for Application No. PCT/US2010/037247; Kim, Chang Gyun, Authorized Officer; Dec. 13, 2010.

* cited by examiner

FIG. 3

| Printer |
|---|
| M1 |
| M2 |
| M3 |
| M4 |
| M1 |
| M2 |
| M3 |
| M4 |

| | Print # | 1 | 2 | 3 | 4 | 5 | 6 | 7 |
|---|---|---|---|---|---|---|---|---|
| A1 | | M1 | | | | | | |
| | | | | | | | | |
| | | | | | | | | |
| A2 | | M2 | | | | | | |
| | | | M1 | | | | | |
| | | | | | | | | |
| A3 | | M3 | | | | | | |
| | | | M2 | | | | | |
| | | | | M1 | | | | |
| | | M4 | | | | | | |
| | | | M3 | | | | | |
| | | | | M2 | | | | |
| | | M1 | | | | | | |
| | | | M4 | | | | | |
| | | | | M3 | | | | |
| | | M2 | | | | | | |
| | | | M1 | | | | | |
| | | | | M4 | | | | |
| | | M3 | | | | | | |
| | | | M2 | | | | | |
| | | | | M1 | | | | |
| | | M4 | | | | | | |
| A4 | | | M3 | | | | | |
| | | | | M2 | | | | |
| | | | | | M1 | | | |
| | | | M4 | | | | | |
| | | | | M3 | | | | |
| A5 | | | | M2 | | | | |
| | | | | | M1 | | | |
| | | | | M4 | | | | |
| | | | | | M3 | | | |
| | | | | | M2 | | | |
| A6 | | | | | | M1 | | |
| | | | | | M4 | | | |
| | | | | | | M3 | | |
| | | | | | | M2 | | |
| | | | | | M1 | | | |
| | | | | | M4 | | | |
| | | | | | | M3 | | |
| | | | | | | M2 | | |
| | | | | | M1 | | | |
| | | | | | | M4 | | |
| | | | | | | M3 | | |
| | | | | | | M2 | | |
| | | | | | | M1 | | |
| | | | | | M4 | | | |
| | | | | | | M3 | | |
| | | | | | | M2 | | |
| | | | | | | | M1 | |
| | | | | | | M4 | | |
| | | | | | | | M3 | |
| | | | | | | | | M2 |

| Pattern | Subpixel Row |
|---|---|
| M1 row | 1 |
| | 2 |
| | 3 |
| M2 row | 4 |
| M1 row | 5 |
| | 6 |
| M3 row | 7 |
| M2 row | 8 |
| M1 row | 9 |
| M4 row | 10 |
| M3 row | 11 |
| M2 row | 12 |
| M1 row | 13 |
| M4 row | 14 |
| M3 row | 15 |
| M2 row | 16 |
| M1 row | 17 |
| M4 row | 18 |
| M3 row | 19 |
| M2 row | 20 |
| M1 row | 21 |
| M4 row | 22 |
| M3 row | 23 |
| M2 row | 24 |
| M1 row | 25 |
| M4 row | 26 |
| M3 row | 27 |
| M2 row | 28 |
| M1 row | 29 |
| M4 row | 30 |
| M3 row | 31 |
| M2 row | 32 |
| M1 row | 33 |
| M4 row | 34 |
| M3 row | 35 |
| M2 row | 36 |
| M1 row | 37 |
| M4 row | 38 |
| M3 row | 39 |
| M2 row | 40 |
| M1 row | 41 |
| M4 row | 42 |
| M3 row | 43 |
| M2 row | 44 |
| M1 row | 45 |
| M4 row | 46 |
| M3 row | 47 |
| M2 row | 48 |
| M1 row | 49 |
| M4 row | 50 |
| M3 row | 51 |
| M2 row | 52 |

FIG. 3 (cont.)

| Print # | 1 | 2 | 3 | 4 | 5 | 6 | 7 |
|---|---|---|---|---|---|---|---|
|  |  |  |  |  |  |  |  |
|  |  |  |  |  |  | M4 |  |
|  |  |  |  |  |  |  | M3 |
|  |  |  |  |  |  |  |  |
|  |  |  |  |  |  |  |  |
|  |  |  |  |  |  |  | M4 |
|  |  |  |  |  |  |  |  |
|  |  |  |  |  |  |  |  |
|  |  |  |  |  |  |  | M1 |
|  |  |  |  |  |  |  |  |
|  |  |  |  |  |  |  |  |
|  |  |  |  |  |  |  | M2 |
|  |  |  |  |  |  |  |  |
|  |  |  |  |  |  |  |  |
|  |  |  |  |  |  |  | M3 |
|  |  |  |  |  |  |  |  |
|  |  |  |  |  |  |  |  |
|  |  |  |  |  |  |  | M4 |

| Pattern | Subpixel Row |
|---|---|
|  | 53 |
| M4 row | 54 |
| M3 row | 55 |
|  | 56 |
|  | 57 |
| M4 row | 58 |
|  | 59 |
|  | 60 |
| M1 row | 61 |
|  | 62 |
|  | 63 |
| M2 row | 64 |
|  | 65 |
|  | 66 |
| M3 row | 67 |
|  | 68 |
|  | 69 |
| M4 row | 70 |

FIG. 4

| Printer |
|---|
| M1 |
| M2 |
| M3 |
| M4 |
| M1 |
| M2 |
| M3 |
| M4 |

| | Print # | 1 | 2 | 3 | 4 | 5 | 6 | 7 | | Pattern | Subpixel Row |
|---|---|---|---|---|---|---|---|---|---|---|---|
| A1 | | M1 | | | | | | | | M1 row | 1 |
| | | | | | | | | | | | 2 |
| | | | | | | | | | | | 3 |
| | | M2 | | | | | | | | M2 row | 4 |
| | | | | | | | | | | | 5 |
| | | | | | | | | | | | 6 |
| | | M3 | | | | | | | | M3 row | 7 |
| | | | | | | | | | | | 8 |
| | | | | | | | | | | | 9 |
| | | M4 | | | | | | | | M4 row | 10 |
| | | | | | | | | | | | 11 |
| | | | | | | | | | | | 12 |
| | | M1 | | | | | | | | M1 row | 13 |
| | | | | | | | | | | | 14 |
| | | | | | | | | | | | 15 |
| | | M2 | | | | | | | | M2 row | 16 |
| A2 | | | M1 | | | | | | | M1 row | 17 |
| | | | | | | | | | | | 18 |
| | | M3 | | | | | | | | M3 row | 19 |
| | | | M2 | | | | | | | M2 row | 20 |
| A3 | | | | M1 | | | | | | M1 row | 21 |
| | | M4 | | | | | | | | M4 row | 22 |
| | | | M3 | | | | | | | M3 row | 23 |
| | | | | M2 | | | | | | M2 row | 24 |
| A4 | | | | | M1 | | | | | M1 row | 25 |
| | | | M4 | | | | | | | M4 row | 26 |
| | | | | M3 | | | | | | M3 row | 27 |
| | | | | | M2 | | | | | M2 row | 28 |
| | | | M1 | | | | | | | M1 row | 29 |
| | | | | M4 | | | | | | M4 row | 30 |
| | | | | | M3 | | | | | M3 row | 31 |
| | | | M2 | | | | | | | M2 row | 32 |
| | | | | M1 | | | | | | M1 row | 33 |
| | | | | | M4 | | | | | M4 row | 34 |
| | | | M3 | | | | | | | M3 row | 35 |
| | | | | M2 | | | | | | M2 row | 36 |
| | | | | | M1 | | | | | M1 row | 37 |
| | | | M4 | | | | | | | M4 row | 38 |
| | | | | M3 | | | | | | M3 row | 39 |
| | | | | M2 | | | | | | M2 row | 40 |
| A5 | | | | | | M1 | | | | M1 row | 41 |
| | | | | M4 | | | | | | M4 row | 42 |
| | | | | | M3 | | | | | M3 row | 43 |
| | | | | | | M2 | | | | M2 row | 44 |
| A6 | | | | | | | M1 | | | M1 row | 45 |
| | | | | | M4 | | | | | M4 row | 46 |
| | | | | | | M3 | | | | M3 row | 47 |
| | | | | | | | M2 | | | M2 row | 48 |
| A7 | | | | | | | | M1 | | | 49 |
| | | | | | | M4 | | | | M4 row | 50 |
| | | | | | | | M3 | | | M3 row | 51 |
| | | | | | | | | M2 | | | 52 |

FIG. 4 (cont.)

| Print # | 1 | 2 | 3 | 4 | 5 | 6 | 7 |
|---|---|---|---|---|---|---|---|
| | | | | | M1 | | |
| | | | | | | M4 | |
| | | | | | | | M3 |
| | | | | | M2 | | |
| | | | | | | M1 | |
| | | | | | | | M4 |
| | | | | | M3 | | |
| | | | | | | M2 | |
| | | | | | | | M1 |
| | | | | | M4 | | |
| | | | | | | M3 | |
| | | | | | | | M2 |
| | | | | | | | |
| | | | | | | M4 | |
| | | | | | | | M3 |
| | | | | | | | |
| | | | | | | | |
| | | | | | | | M4 |

| Pattern | Subpixel Row |
|---|---|
| M1 row | 53 |
| M4 row | 54 |
| M3 row | 55 |
| M2 row | 56 |
| M1 row | 57 |
| M4 row | 58 |
| M3 row | 59 |
| M4 row | 60 |
| M1 row | 61 |
| M4 row | 62 |
| M3 row | 63 |
| M2 row | 64 |
| | 65 |
| M4 row | 66 |
| M3 row | 67 |
| | 68 |
| | 69 |
| M4 row | 70 |

FIG. 5

| Printer |
|---|
| M1 |
| M2 |
| M3 |
| M4 |
| M1 |
| M2 |
| M3 |
| M4 |

| | Print # | 1 | 2 | 3 | 4 |
|---|---|---|---|---|---|
| A1 | | M1 | | | |
| | | | | | |
| | | | | | |
| | | M2 | | | |
| | | | | | |
| | | | | | |
| | | M3 | | | |
| A2 | | | | | |
| | | | M1 | | |
| | | M4 | | | |
| | | | | | |
| | | | M2 | | |
| | | M1 | | | |
| | | | | | |
| | | | M3 | | |
| A3 | | M2 | | | |
| | | | | M1 | |
| | | | M4 | | |
| | | M3 | | | |
| | | | | M2 | |
| | | | M1 | | |
| | | M4 | | | |
| | | | | M3 | |
| A4 | | | M2 | | |
| | | | | | M1 |
| | | | | M4 | |
| | | | M3 | | |
| | | | | | M2 |
| | | | | M1 | |
| | | | M4 | | |
| | | | | | M3 |
| | | | | M2 | |
| | | | | | |
| | | | | | M4 |
| | | | | M3 | |
| | | | | | |
| | | | | | M1 |
| | | | | M4 | |
| | | | | | |
| | | | | | M2 |
| | | | | | |
| | | | | | |
| | | | | | M3 |
| | | | | | |
| | | | | | |
| | | | | | M4 |

| Pattern | Subpixel Row |
|---|---|
| M1 row | 1 |
| | 2 |
| | 3 |
| M2 row | 4 |
| | 5 |
| | 6 |
| M3 row | 7 |
| | 8 |
| M1 row | 9 |
| M4 row | 10 |
| | 11 |
| M2 row | 12 |
| M1 row | 13 |
| | 14 |
| M3 row | 15 |
| M2 row | 16 |
| M1 row | 17 |
| M4 row | 18 |
| M3 row | 19 |
| M2 row | 20 |
| M1 row | 21 |
| M4 row | 22 |
| M3 row | 23 |
| M2 row | 24 |
| M1 row | 25 |
| M4 row | 26 |
| M3 row | 27 |
| M2 row | 28 |
| M1 row | 29 |
| M4 row | 30 |
| M3 row | 31 |
| M2 row | 32 |
| | 33 |
| M4 row | 34 |
| M3 row | 35 |
| | 36 |
| M1 row | 37 |
| M4 row | 38 |
| | 39 |
| M2 row | 40 |
| | 41 |
| | 42 |
| M3 row | 43 |
| | 44 |
| | 45 |
| M4 row | 46 |

FIG. 6

| Printer |
|---|
| M1 |
| M2 |
| M3 |
| M4 |
| M1 |
| M2 |
| M3 |
| M4 |
| M1 |
| M2 |
| M3 |
| M4 |

| Print # | | 1 | 2 | 3 | 4 | 5 | 6 |
|---|---|---|---|---|---|---|---|
| A1 | | M1 | | | | | |
|  | | | M2 | | | | |
|  | | | | M3 | | | |
| A2 | | M2 | | | | | |
|  | | M1 | | | | | |
|  | | | M4 | | | | |
| A3 | | M3 | | | | | |
|  | | | M2 | | | | |
|  | | | | M1 | | | |
|  | | M4 | | | | | |
|  | | | M3 | | | | |
|  | | | | M2 | | | |
|  | | M1 | | | | | |
|  | | | M4 | | | | |
|  | | | | M3 | | | |
|  | | M2 | | | | | |
|  | | | M1 | | | | |
|  | | | | M4 | | | |
|  | | M3 | | | | | |
|  | | | M2 | | | | |
|  | | | | M1 | | | |
|  | | M4 | | | | | |
|  | | | M3 | | | | |
|  | | | | M2 | | | |
|  | | M1 | | | | | |
|  | | | M4 | | | | |
|  | | | | M3 | | | |
|  | | M2 | | | | | |
|  | | | M1 | | | | |
|  | | | | M4 | | | |
|  | | M3 | | | | | |
|  | | | M2 | | | | |
|  | | | | M1 | | | |
|  | | M4 | | | | | |
|  | | | M3 | | | | |
|  | | | | M2 | | | |
| A4 | | | | | M1 | | |
|  | | | M4 | | | | |
|  | | | | M3 | | | |
|  | | | | M2 | | | |
| A5 | | | | | | M1 | |
|  | | | | M4 | | | |
|  | | | | M3 | | | |
|  | | | | | M2 | | |
| A6 | | | | | | | M1 |
|  | | | | | M4 | | |
|  | | | | | M3 | | |
|  | | | | | | M2 | |
|  | | | | M1 | | | |
|  | | | | | M4 | | |
|  | | | | | | M3 | |
|  | | | | M2 | | | |

| Pattern | Subpixel Row |
|---|---|
| M1 row | 1 |
|  | 2 |
|  | 3 |
| M2 row | 4 |
| M1 row | 5 |
|  | 6 |
| M3 row | 7 |
| M2 row | 8 |
| M1 row | 9 |
| M4 row | 10 |
| M3 row | 11 |
| M2 row | 12 |
| M1 row | 13 |
| M4 row | 14 |
| M3 row | 15 |
| M2 row | 16 |
| M1 row | 17 |
| M4 row | 18 |
| M3 row | 19 |
| M2 row | 20 |
| M1 row | 21 |
| M4 row | 22 |
| M3 row | 23 |
| M2 row | 24 |
| M1 row | 25 |
| M4 row | 26 |
| M3 row | 27 |
| M2 row | 28 |
| M1 row | 29 |
| M4 row | 30 |
| M3 row | 31 |
| M2 row | 32 |
| M1 row | 33 |
| M4 row | 34 |
| M3 row | 35 |
| M2 row | 36 |
| M1 row | 37 |
| M4 row | 38 |
| M3 row | 39 |
| M2 row | 40 |
| M1 row | 41 |
| M4 row | 42 |
| M3 row | 43 |
| M2 row | 44 |
| M1 row | 45 |
| M4 row | 46 |
| M3 row | 47 |
| M2 row | 48 |
| M1 row | 49 |
| M4 row | 50 |
| M3 row | 51 |
| M2 row | 52 |

FIG. 6 (cont.)

| Print # | 1 | 2 | 3 | 4 | 5 | 6 | | Pattern | Subpixel Row |
|---|---|---|---|---|---|---|---|---|---|
| | | | | | M1 | | | M1 row | 53 |
| | | | | | | M4 | | M4 row | 54 |
| | | | | M3 | | | | M3 row | 55 |
| | | | | | M2 | | | M2 row | 56 |
| | | | | | | M1 | | M1 row | 57 |
| | | | | M4 | | | | M4 row | 58 |
| | | | | | M3 | | | M3 row | 59 |
| | | | | | | M2 | | M2 row | 60 |
| | | | | M1 | | | | M1 row | 61 |
| | | | | | M4 | | | M4 row | 62 |
| | | | | | | M3 | | M3 row | 63 |
| | | | | M2 | | | | M2 row | 64 |
| | | | | | M1 | | | M1 row | 65 |
| | | | | | | M4 | | M4 row | 66 |
| | | | | M3 | | | | M3 row | 67 |
| | | | | | M2 | | | M2 row | 68 |
| | | | | | | M1 | | M1 row | 69 |
| | | | | M4 | | | | M4 row | 70 |
| | | | | | M3 | | | M3 row | 71 |
| | | | | | | M2 | | M2 row | 72 |
| | | | | | | | | | 73 |
| | | | | | M4 | | | M4 row | 74 |
| | | | | | | M3 | | M3 row | 75 |
| | | | | | | | | | 76 |
| | | | | | | | | | 77 |
| | | | | | | M4 | | M4 row | 78 |

FIG. 7

| Printer |
|---|
| M1 |
| M2 |
| M3 |
| M4 |
| M1 |
| M2 |
| M3 |
| M4 |
| M1 |
| M2 |
| M3 |
| M4 |

| Pattern | Print # 1 | 2 | 3 | 4 | 5 | 6 |
|---|---|---|---|---|---|---|
| A1 | M1 | | | | | |
|  | | | | | | |
|  | | | | | | |
|  | M2 | | | | | |
|  | | | | | | |
|  | | | | | | |
|  | M3 | | | | | |
|  | | | | | | |
| A2 | | M1 | | | | |
|  | M4 | | | | | |
|  | | | | | | |
|  | | M2 | | | | |
|  | M1 | | | | | |
|  | | | | | | |
|  | | M3 | | | | |
|  | M2 | | | | | |
| A3 | | | M1 | | | |
|  | | M4 | | | | |
|  | M3 | | | | | |
|  | | | M2 | | | |
|  | | M1 | | | | |
|  | M4 | | | | | |
|  | | | M3 | | | |
|  | | M2 | | | | |
|  | M1 | | | | | |
|  | | | M4 | | | |
|  | | M3 | | | | |
|  | M2 | | | | | |
|  | | | M1 | | | |
|  | | M4 | | | | |
|  | M3 | | | | | |
|  | | | M2 | | | |
|  | | M1 | | | | |
|  | M4 | | | | | |
|  | | | M3 | | | |
|  | | M2 | | | | |
| A4 | | | | M1 | | |
|  | | | M4 | | | |
|  | | M3 | | | | |
|  | | | | M2 | | |
|  | | | M1 | | | |
|  | | M4 | | | | |
|  | | | M3 | | | |
|  | | | M2 | | | |
| A5 | | | | | M1 | |
|  | | | | M4 | | |
|  | | | M3 | | | |
|  | | | | | M2 | |
|  | | | | M1 | | |
|  | | | M4 | | | |
|  | | | | M3 | | |
|  | | | | M2 | | |

| Pattern | Subpixel Row |
|---|---|
| M1 row | 1 |
|  | 2 |
|  | 3 |
| M2 row | 4 |
|  | 5 |
|  | 6 |
| M3 row | 7 |
|  | 8 |
| M1 row | 9 |
| M4 row | 10 |
|  | 11 |
| M2 row | 12 |
| M1 row | 13 |
|  | 14 |
| M3 row | 15 |
| M2 row | 16 |
| M1 row | 17 |
| M4 row | 18 |
| M3 row | 19 |
| M2 row | 20 |
| M1 row | 21 |
| M4 row | 22 |
| M3 row | 23 |
| M2 row | 24 |
| M1 row | 25 |
| M4 row | 26 |
| M3 row | 27 |
| M2 row | 28 |
| M1 row | 29 |
| M4 row | 30 |
| M3 row | 31 |
| M2 row | 32 |
| M1 row | 33 |
| M4 row | 34 |
| M3 row | 35 |
| M2 row | 36 |
| M1 row | 37 |
| M4 row | 38 |
| M3 row | 39 |
| M2 row | 40 |
| M1 row | 41 |
| M4 row | 42 |
| M3 row | 43 |
| M2 row | 44 |
| M1 row | 45 |
| M4 row | 46 |
| M3 row | 47 |
| M2 row | 48 |
| M1 row | 49 |
| M4 row | 50 |
| M3 row | 51 |
| M2 row | 52 |

FIG. 7 (cont.)

| Print # | 1 | 2 | 3 | 4 | 5 | 6 |
|---------|---|---|---|---|---|---|
| A6      |   |   |   |   |   | M1 |
|         |   |   |   |   | M4 |   |
|         |   |   |   | M3 |   |   |
|         |   |   |   |   |   | M2 |
|         |   |   |   |   | M1 |   |
|         |   |   |   | M4 |   |   |
|         |   |   |   |   |   | M3 |
|         |   |   |   |   | M2 |   |
|         |   |   |   | M1 |   |   |
|         |   |   |   |   |   | M4 |
|         |   |   |   |   | M3 |   |
|         |   |   |   | M2 |   |   |
|         |   |   |   |   |   | M1 |
|         |   |   |   |   | M4 |   |
|         |   |   |   | M3 |   |   |
|         |   |   |   |   |   | M2 |
|         |   |   |   |   | M1 |   |
|         |   |   |   | M4 |   |   |
|         |   |   |   |   |   | M3 |
|         |   |   |   |   | M2 |   |
|         |   |   |   |   |   |   |
|         |   |   |   |   |   | M4 |
|         |   |   |   |   | M3 |   |
|         |   |   |   |   |   |   |
|         |   |   |   |   |   | M1 |
|         |   |   |   |   | M4 |   |
|         |   |   |   |   |   |   |
|         |   |   |   |   |   | M2 |
|         |   |   |   |   |   |   |
|         |   |   |   |   |   |   |
|         |   |   |   |   |   | M3 |
|         |   |   |   |   |   |   |
|         |   |   |   |   |   |   |
|         |   |   |   |   |   | M4 |

| Pattern | Subpixel Row |
|---------|-------------|
| M1 row  | 53 |
| M4 row  | 54 |
| M3 row  | 55 |
| M2 row  | 56 |
| M1 row  | 57 |
| M4 row  | 58 |
| M3 row  | 59 |
| M2 row  | 60 |
| M1 row  | 61 |
| M4 row  | 62 |
| M3 row  | 63 |
| M2 row  | 64 |
| M1 row  | 65 |
| M4 row  | 66 |
| M3 row  | 67 |
| M2 row  | 68 |
| M1 row  | 69 |
| M4 row  | 70 |
| M3 row  | 71 |
| M2 row  | 72 |
|         | 73 |
| M4 row  | 74 |
| M3 row  | 75 |
|         | 76 |
| M1 row  | 77 |
| M4 row  | 78 |
|         | 79 |
| M2 row  | 80 |
|         | 81 |
|         | 82 |
| M3 row  | 83 |
|         | 84 |
|         | 85 |
| M4 row  | 86 |

FIG. 8

| Printer | | Print # | 1 | 2 | 3 | 4 | 5 | 6 |
|---|---|---|---|---|---|---|---|---|
| M1 | | A1 | M1 | | | | | |
| | | | | | | | | |
| | | | | | | | | |
| M2 | | | M2 | | | | | |
| | | A2 | | M1 | | | | |
| | | | | | | | | |
| blank | | | | | | | | |
| | | | | M2 | | | | |
| | | A3 | | | M1 | | | |
| M3 | | | M3 | | | | | |
| | | | | | | | | |
| | | | | | M2 | | | |
| M1 | | | M1 | | | | | |
| | | | | M3 | | | | |
| | | | | | | | | |
| M2 | | | M2 | | | | | |
| | | | | M1 | | | | |
| | | | | | M3 | | | |
| blank | | | | | | | | |
| | | | | M2 | | | | |
| | | | | | M1 | | | |
| M3 | | | M3 | | | | | |
| | | | | | | | | |
| | | | | | M2 | | | |
| | | A4 | | | | M1 | | |
| | | | | M3 | | | | |
| | | | | | | | | |
| | | | | | M2 | | | |
| | | A5 | | | | M1 | | |
| | | | | | M3 | | | |
| | | | | | | | | |
| | | | | | | M2 | | |
| | | A6 | | | | | M1 | |
| | | | | | M3 | | | |
| | | | | | | | | |
| | | | | | | M2 | | |
| | | | | | M1 | | | |
| | | | | | | M3 | | |
| | | | | | | | | |
| | | | | | | M2 | | |
| | | | | | | M1 | | |
| | | | | | | | M3 | |
| | | | | | | | | |
| | | | | | | M2 | | |
| | | | | | | | M1 | |
| | | | | | | M3 | | |
| | | | | | | | | |
| | | | | | | | M2 | |
| | | | | | | | | M3 |
| | | | | | | | | |
| | | | | | | | | |
| | | | | | | | | |
| | | | | | | | | M3 |

| Pattern | Subpixel Row |
|---|---|
| M1 row | 1 |
| | 2 |
| | 3 |
| M2 row | 4 |
| M1 row | 5 |
| | 6 |
| | 7 |
| M2 row | 8 |
| M1 row | 9 |
| M3 row | 10 |
| | 11 |
| M2 row | 12 |
| M1 row | 13 |
| M3 row | 14 |
| | 15 |
| M2 row | 16 |
| M1 row | 17 |
| M3 row | 18 |
| | 19 |
| M2 row | 20 |
| M1 row | 21 |
| M3 row | 22 |
| | 23 |
| M2 row | 24 |
| M1 row | 25 |
| M3 row | 26 |
| | 27 |
| M2 row | 28 |
| M1 row | 29 |
| M3 row | 30 |
| | 31 |
| M2 row | 32 |
| M1 row | 33 |
| M3 row | 34 |
| | 35 |
| M2 row | 36 |
| M1 row | 37 |
| M3 row | 38 |
| | 39 |
| M2 row | 40 |
| M1 row | 41 |
| M3 row | 42 |
| | 43 |
| M2 row | 44 |
| M1 row | 45 |
| M3 row | 46 |
| | 47 |
| M2 row | 48 |
| | 49 |
| M3 row | 50 |
| | 51 |
| | 52 |
| | 53 |
| M3 row | 54 |

MULTICOLOR ELECTRONIC DEVICES AND PROCESSES OF FORMING THE SAME BY PRINTING

RELATED APPLICATION

This application claims priority under 35 U.S.C. §119(e) from Provisional Application No. 61/184,086 filed Jun. 4, 2009 which is incorporated by reference in its entirety.

FIELD OF THE DISCLOSURE

This disclosure relates in general to electronic devices and processes, and more particularly, to electronic devices having electrodes and organic active regions of different colors, and processes of forming the same.

DESCRIPTION OF THE RELATED ART

An electronic device can include a liquid crystal display ("LCD"), an organic light-emitting diode (OLED) display, or the like. The manufacture of electronic devices may be performed using solution deposition techniques. One process of making electronic devices is to deposit organic layers over a substrate by printing (e.g., inkjet printing, continuous printing, etc.). In a printing process, the liquid composition being printed includes an organic material in a solution, dispersion, emulsion, or suspension with an organic solvent, with an aqueous solvent, or with a combination of solvents. After printing, the solvent(s) is(are) evaporated and the organic material remains to form an organic layer for the electronic device.

Typically, a first color is printed and then the printing device is recalibrated and a second color is printed. In some cases, the substrate with the first printed color is moved to a second printer for printing the second color. This also requires time for setting up the printer and alignment. In many cases, three colors are printed; red, green, and blue. In this case, time must be taken to recalibrate and/or realign with each color. There is a need for improved printing processes.

SUMMARY

There is provided a process of forming a regular array of rows of subpixels on a workpiece, the subpixels having four different colors, and having a subpixel pitch s, and wherein q colors are formed by printing and r colors are formed by a non-printing method, said process comprising:

(1) providing a printing head having z nozzles arranged in a row with a spacing between the nozzles of p, where $z=4n_1$ and $p=3s$, the printhead being at a first position relative to the workpiece;
(2) providing q different printing inks, one for each of the q printed colors;
(3) supplying each of the printing inks to the nozzles in a regular alternating pattern;
(4) printing a first set of z rows of subpixels with the printing head;
(5) moving and printing in a first printing pattern comprising:
 (a) moving the workpiece laterally relative to the printing head by a distance $d_1$, where $d_1=4n_2s$;
 (b) printing a set of z rows of subpixels with the printing head;
(6) moving and printing in a second printing pattern comprising:
 (c) moving the workpiece laterally relative to the printing head by a distance $d_2$, where $d_2=d_1$;
 (d) printing a set of z rows of subpixels with the printing head;
(7) moving and printing in a third printing pattern comprising:
 (e) moving the workpiece laterally relative to the printing head by a distance $d_3$, where $d_3=4n_3s$, such that $d_1+d_2+d_3=pz$; and
 (f) printing a set of z rows of subpixels with the printing head;
(8) repeating steps (5) through (7) multiple times in the same order; and
(9) applying r colors by a non-printing method;
where:
 $n_1$ is an integer greater than 0;
 $n_2$ is an integer greater than 0, such that the integer is not a multiple of three and $n_2 \le n_1$;
 $n_3$ is an integer such that $2n_2+n_3=3n_1$;
 q is an integer from 1-4; and
 r is an integer, such that $q+r=4$;
and wherein the patterns are carried out in the order (i) first printing pattern, followed by second printing pattern, followed by third printing pattern, or (ii) third printing pattern, followed by first printing pattern, followed by second printing pattern.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 3 includes a diagram illustrating a printing method with eight nozzles.

FIG. 4 includes diagram illustrating another printing method with eight nozzles FIG. 5 includes a diagram illustrating another printing method with eight nozzles.

FIG. 6 includes a diagram illustrating another printing method with 12 nozzles.

FIG. 7 includes a diagram illustrating another printing method with 12 nozzles.

FIG. 8 includes a diagram illustrating another printing method with eight nozzles.

Figure 1:
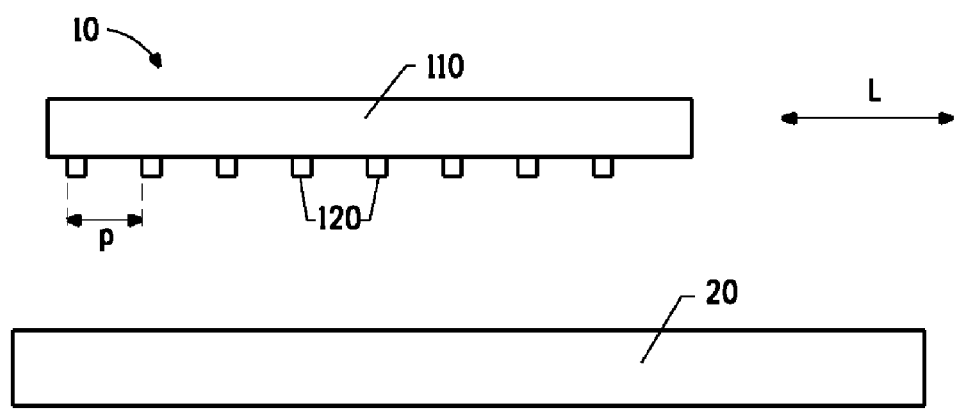
FIG. 1 includes an illustration of a cross-sectional view of the workpiece and a printer.

Skilled artisans appreciate that elements in the figures are illustrated for simplicity and clarity and have not necessarily been drawn to scale. For Example, the dimensions of some of the elements in the figures may be exaggerated relative to other elements to help to improve understanding of embodiments of the invention.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Printer, the Printing Process, the Electronic Device, and finally, Examples.

1. DEFINITIONS AND CLARIFICATION OF TERMS

Before addressing details of embodiments described below, some terms are defined or clarified.

The term "array" is intended to mean an ordered arrangement of elements. An array may include pixels, subpixels, cells, or other structures within an ordered arrangement, usually designated by columns and rows. The array can be described in terms of an x-direction and a y-direction.

The term "blue" refers to light having a wavelength in a range of approximately 400 to 500 nm.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "electronic device" is intended to mean a collection of circuits, electronic components, or any combination thereof that collectively, when properly electrically connected and supplied with the appropriate potential(s), performs a function. An electronic device may be included or be part of a system. An Example of an electronic device includes a display, a sensor array, a computer system, an avionics system, an automobile, a cellular phone, other consumer or industrial electronic product, or any combination thereof.

The term "green" refers to light having a wavelength in a range of approximately 500 to 600 nm.

The term "integer" as used herein does not encompass negative integers.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid medium" is intended to mean a liquid within a solution, dispersion, suspension, or emulsion. The term "liquid medium" is used regardless whether one or more solvents are present, and therefore, liquid medium is used as the singular or plural form (i.e., liquid media) of the term.

The term "nozzle" is intended to mean a portion of an apparatus through which a liquid composition or liquid medium can be dispensed.

The term "oriented" is intended to mean a principal direction in which a feature extends. As between different features at the same elevation or at different elevations, the features may be oriented substantially parallel, substantially perpendicular, or in another angular relationship with respect to each other.

The term "organic active layer" is intended to mean one or more organic layers, wherein at least one of the organic layers, by itself, or when in contact with a dissimilar material is capable of forming a rectifying junction. The term "organic active region" is intended to mean one or more organic region, wherein at least one of the organic regions, by itself, or when in contact with a dissimilar material is capable of forming a rectifying junction.

The term "pitch" is intended to mean a sum of a feature dimension and a space dimension between immediately adjacent features.

The term "pixel" is intended to mean the smallest complete, repeating unit of an array. The term "subpixel" is intended to mean a portion of a pixel that makes up only a part, but not all, of a pixel, A subpixel is one of the components of a pixel used in the representation of a color image. Each subpixel represents the contribution of a single color to the overall color and brightness of the pixel. A sensor array can include pixels that may or may not include subpixels.

The term "printing" is intended to mean an act of selectively depositing a layer by using a printing head or other similar structure to dispense a liquid or liquid composition onto a workpiece.

The term "printing apparatus" is intended to mean a combination of one or more materials, equipment, assembly or subassembly designed for printing a layer onto a workpiece.

The term "red" refers to light having a wavelength in a range of approximately 600 to 750 nm.

The term "resolution limit" is intended to mean the smallest feature size that can be reproducibly formed when using a particular apparatus OF other equipment.

The term "white" refers to light broadly having wavelengths in the range of approximately 380 to 750 nm.

The term "workpiece" is intended to mean a substrate with one or more device layers thereon. A device layer can be inorganic or organic.

The term "yellow" refers to light having a wavelength in the range of 570 to 600 nm.

As used herein, the terms "comprises," "comprising," "includes," "including," "has," "having" or any other variation thereof, are intended to cover a non-exclusive inclusion. For Example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For Example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics,* $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. PRINTER

Before addressing particular embodiments, the printer is addressed to aid in understanding the concepts as described herein.

As shown in FIG. 1, printer 10 has a printing head 110 with eight nozzles 120 attached. The spacing between the nozzles is shown as p. The printer is attached to lines (not shown) to supply the appropriate liquid composition to each nozzle. The different liquid compositions, one for each of the four colors, are supplied in a regular alternating pattern. By this is meant that one of each color is supplied before any are duplicated, and that additional colors are supplied in the same order. In this figure, the first nozzle can have color 1, the second nozzle color 2, the third nozzle color 3, the fourth nozzle color 4, the fifth nozzle color 1, the sixth nozzle color 2, the seventh nozzle color 3, and the eights nozzle color 4. Thus, in this system, $z=4n_1=8$, where $n_1=2$.

The printing head is shown over workpiece 20. The printing head and workpiece can be moved with respect to each other. When printing, the printing head will move in the direction in and out of the plane of the paper with respect to the workpiece. The printing head will also move laterally with respect to the workpiece as shown by L. This movement is relative. In some cases, the workpiece is moved. In some cases, the printing head is moved. In some cases, both the printing head and the workpiece are moved. For simplicity, the movement will be addressed as if only the printing head moved, and as if the workpiece were stationary. It will be understood that either or both of the printing head and workpiece can be moved and it is only their movement relative to each other that is at issue.

In the embodiment shown in FIG. 1, the printer has eight nozzles. The actual number of nozzles can be greater than this and is limited only by practical manufacturing considerations. In some embodiments, the number of nozzles is at least eight. In some embodiments, the number of nozzles ranges from 8 to 36; in some embodiments, from 20-32.

The printing delivery can be by any known system for depositing liquid materials. Some examples of printing techniques include, but are not limited to ink jet and continuous nozzle spray.

3. PRINTING PROCESS

Figure 2:
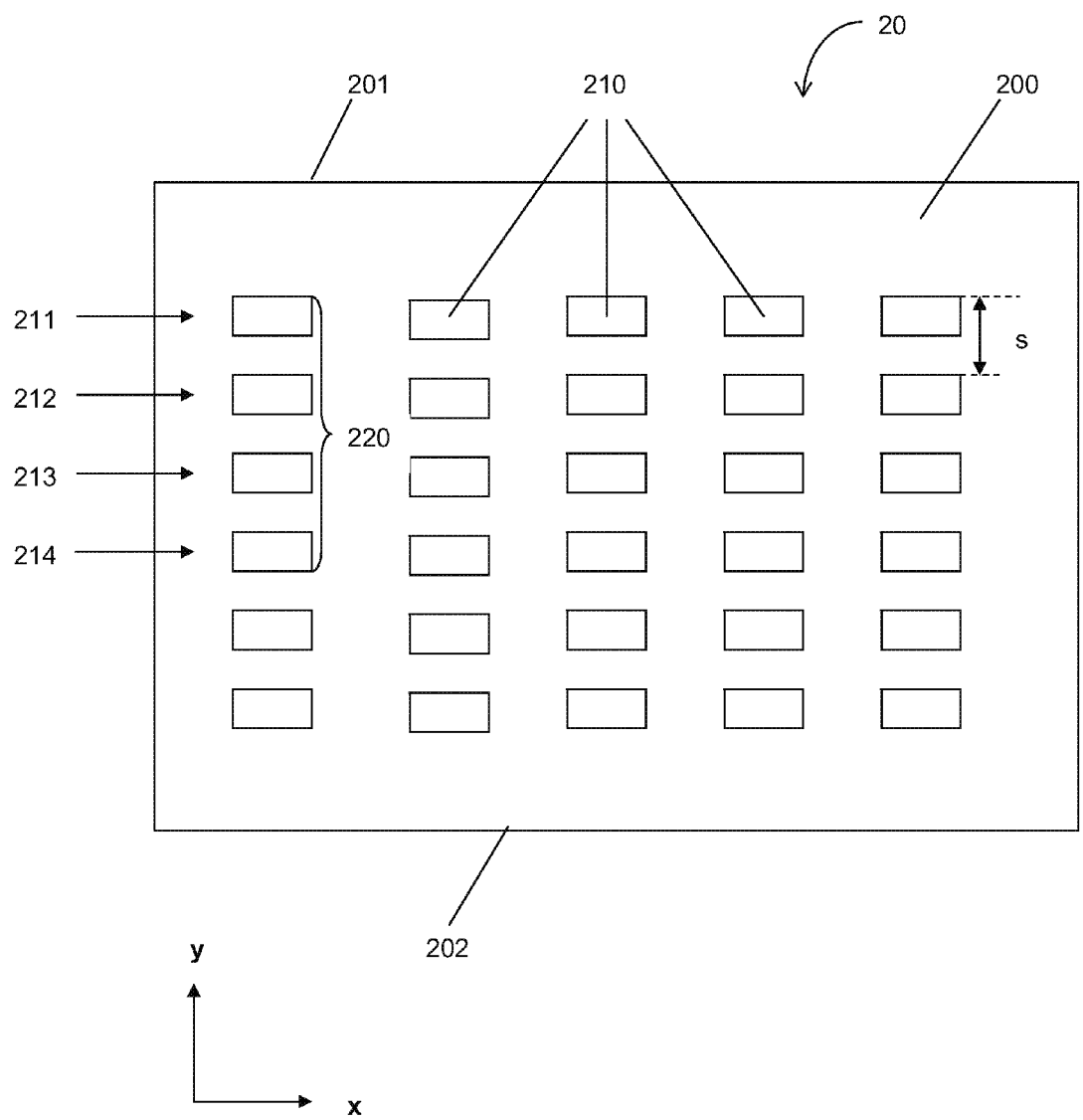
FIG. 2 includes a plan view of a workpiece for making an electronic device including a display.

FIG. 2 includes a plan view of workpiece 20 for making an electronic device. The workpiece includes a substrate 200 having a regular array of subpixel openings 210. The workpiece has a first edge 201 and an opposite edge 202. Only a few subpixels are illustrated in the figure. In practice, devices may have hundreds of subpixels or more. In some embodiments, the subpixel openings are defined by a containment structure (not shown) which can be a physical containment structure, a chemical containment structure, or both. The subpixel openings 210 are in a regular array of rows, shown as 211, 212, 213, and 214. The subpixel pitch is shown as s. In some embodiments, subpixel pitch is in the range of 1-100 microns; in some embodiments, 2-20 microns. Four subpixels together form pixel 220. In the illustrated embodiment, the subpixels 210 have a rectangular shape. Other subpixel shapes can be used, such as circular, oval, square, or polygonal. The printing direction is shown as x in the figure. Lateral movement is defined as movement in the y direction, perpendicular to the printing direction.

In the process described herein, a regular array of rows of subpixels of four colors is formed on a workpiece. Of the four colors, q colors are printed and r colors are formed by a non-printing process. The subpixels have a subpixel pitch s. The process comprises:

(1) providing a printing head having z nozzles arranged in a row with a spacing between the nozzles of p, where $z=4n_1$ and $p=3s$, the printhead being at a first position relative to the workpiece;

(2) providing q different printing inks, one for each of the q printed colors;

(3) supplying each of the printing inks to the nozzles in a regular alternating pattern;

(4) printing a first set of z rows of subpixels with the printing head;

(5) moving and printing in a first printing pattern comprising:
  (a) moving the workpiece laterally relative to the printing head by a distance $d_1$, where $d_1=4n_2s$;
  (b) printing a set of z rows of subpixels with the printing head;

(6) moving and printing in a second printing pattern comprising:
  (c) moving the workpiece laterally relative to the printing head by a distance $d_2$, where $d_2=d_1$;
  (d) printing a set of z rows of subpixels with the printing head;

(7) moving and printing in a third printing pattern comprising:
  (e) moving the workpiece laterally relative to the printing head by a distance $d_3$, where $d_3=4n_3s$, such that $d_1+d_2+d_3=pz$; and
  (f) printing a set of z rows of subpixels with the printing head;

(8) repeating steps (5) through (7) multiple times in the same order; and (9) applying r colors by a non-printing method;

where;

$n_1$ is an integer greater than 0;

$n_2$ is an integer greater than 0, such that the integer is not a multiple of three and $n_2 \leq n_1$;

$n_3$ is an integer such that $2n_2+n_3=3n_1$;

q is an integer from 1-4; and r is an integer, such that $q+r=4$;

and wherein the patterns are carried out in the order (i) first printing pattern, followed by second printing pattern, followed by third printing pattern, or (ii) third printing pattern, followed by first printing pattern, followed by second printing pattern.

The number of colors to be formed is four. In some embodiments, the colors are red, green, blue and white ("R, G, B, W"). In some embodiments, the colors are red, green, blue and yellow ("R, G, B, Y"). In some embodiments, the colors are yellow, magenta, cyan and black ("Y, M, C, K"). Of the four colors, q colors are formed by printing and r colors are formed by a non-printing process. In some embodiments, q=4 and r=0, and all four colors are printed. In some embodiments, q=3 and r=1. In this case, three of the colors are printed and the fourth color is applied by a non-printing method. The fourth color can be applied before or after printing. In some embodiments, the fourth color is applied after the three printed colors.

The printing head has z nozzles. When all four colors are printed, all z nozzles are present and supplied with ink. When one or more colors are applied by a non-printing method, a nozzle space is present for the non-printed color(s). The nozzle may be present and not supplied with ink, or the nozzle may be physically absent. For the purposes of the printing pattern, a nozzle space is counted as a nozzle.

The number of nozzles, z, is a multiple of the number of colors, 4. Thus, $z=4n_1$, where $n_1$ is an integer greater than 0. In some embodiments, $n_1$ is at least 2. In some embodiments, $n_1=3-9$; in some embodiment, 5-8.

The printing heads starts at a first printing position over the workpiece. This first position is referred to as A1, which will be discussed in a later section. In some embodiments, the printer is positioned at one edge of the workpiece, shown as 201 in FIG. 2, and aligned to be over the first row of subpixels. The nozzles are spaced apart by a distance p, which is equal to three times the subpixel pitch, so that they are all aligned to print in the subpixel rows. Thus, they are spaced apart by a multiple of the subpixel pitch, s, and p=3s. The term "multiple of a number" means a value which is the number times an integer greater than 0.

The printer prints across the workpiece in the x-direction, as shown in FIG. 2, to print a first set of rows of subpixels. The number of rows printed is equal to the number of nozzles on the printing head=z. The number of rows of color deposited is equal to the number of nozzles supplied with color.

After completion of the printing of the first set of rows, a first printing pattern is formed in step (5). The printing head moves laterally across the workpiece to an adjacent printing position. This position is referred to as A2, which will be discussed in a later section. This movement is parallel to the plane of the workpiece and in the y-direction, which is perpendicular to the row direction. The distance moved, $d_1$, is also a multiple of the subpixel pitch, s, and is equal to $4n_2(s)$. The number $n_2$ is an integer that is not a multiple of 3, and is less than or equal to $n_1$. Thus, the lateral movement of the printing head is not a multiple of the nozzle spacing, p, which is 3s. If the lateral movement were a multiple of the nozzle spacing, then some rows could be overprinting where a previous row had been printed. A set of z rows is then printed from position A2. The printing can be in the opposite direction from the first printing or the printing head can return to the same side as for the first printing and print in the same direction. This is determined by the design of the equipment and the software. This completes the printing of the first printing pattern.

After completion of the first printing pattern, a second printing pattern is formed in step (6). The printing head moves laterally across the workpiece to an adjacent printing position. This position is referred to as A3, which will be discussed in a later section. This movement is parallel to the plane of the workpiece and in the y-direction, which is perpendicular to the row direction. The distance moved, $d_2$, is equal to $d_1$.

Another set of z rows is then printed from position A3. The printing can be in the opposite direction from the second printing or the printing head can return to the same side as for the first printing and print in the same direction. This is determined by the design of the equipment and the software. This completes the printing of the second pattern.

After completion of the first printing pattern, a third printing pattern is formed in step (7). The printing head to move laterally across the workpiece to an adjacent printing position. This position is referred to as A4, which will be discussed in a later section. This movement is parallel to the plane of the workpiece and in the y-direction, which is perpendicular to the row direction. The distance moved, $d_3$, is a multiple of the subpixel pitch, s, and is equal to $4n_3(s)$. The sum of the first, second and third lateral movements, $d_1+d_2+d_3$, is equal to pz. Since p=3s and $z=4n_1$, the relationship between $n_1$, $n_2$, and $n_3$ can be derived as follows:

$$d_1+d_2+d_3=pz$$

$$(4n_2s)+(4n_2s)+(4n_3s)=(3s)(4n_1)$$

$$n_2s+n_2s+n_3s=3s(n_1)$$

$$n_2+n_2+n_3=3n_1$$

$$2n_2+n_3=3n_1$$

Another set of z rows is then printed from position A4. The printing can be in the opposite direction from the second printing or the printing head can return to the same side as for the first printing and print in the same direction. This is determined by the design of the equipment and the software. This completes the printing of the third pattern.

In step (8), the steps of printing the first, second and third printing patterns are repeated multiple times in the same order until the desired number of subpixel rows have been printed. The process can be ended after any printing step.

The order for determining the positions for the printer can be: (i) the first pattern is first, followed by the second and third patterns; or (ii) the third pattern is first, followed by the first and second patterns. In the first case, position A2 is laterally spaced by distance $d_1$ from position A1; position A3 is laterally spaced $d_2$ from A2; and position A4 is laterally spaced $d_3$ from position A3. In the second case, position A2 is laterally spaced by distance $d_3$ from position A1; position A3 is laterally spaced $d_1$ from A2; and position A4 is laterally spaced $d_2$ from position A3. Whether the order is (i) or (ii), the same order is maintained in step (8) for all the repetitions.

In practice, although the spatial positioning is determined by the printing patterns, the subpixel rows can be printed in any order. The movements of the printing head relative to the workpiece will be as discussed above, and the subpixel rows will be printed starting from position A1, A2, A3, etc., but not necessarily in order. For Example the printer may print from position A1, then from A4, then from A2, then from A5, and so on. The exact order of printing will generally be determined by the most efficient way to utilize the printer.

In step (9), r colors are applied by a non-printing deposition method. When r=0, there is no step (9). Examples of non-printing methods include, but are not limited to, vapor deposition, thermal transfer, and continuous liquid deposition techniques such as spin coating, gravure coating, curtain coating, dip coating, slot-die coating, and spray coating. In these cases, where r>0, the printing must leave open spaces for the non-printed colors, which can be applied before or after the printing step. For the purposes of the printing pattern, an open space is counted as a color. When r>1, and more the one color is applied by a non-printing deposition method, the same or different non-printing method may be used for the different non-printed colors.

A summary of the different combinations of $d_1$, $d_2$, and $d_3$ for an exemplary, non-limiting set of different numbers of nozzles is given in Table 1. The table represents printing heads having 4-32 nozzles. It will be understood that different numbers of nozzles can also be used, as long as the number is a multiple of 4.

TABLE 1

| z  | $d_1$ | $d_2$ | $d_3$ |
|----|-------|-------|-------|
| 4  | 4     | 4     | 4     |
| 8  | 4     | 4     | 16    |
|    | 8     | 8     | 8     |
| 12 | 4     | 4     | 32    |
|    | 8     | 8     | 20    |
| 16 | 4     | 4     | 40    |
|    | 8     | 8     | 32    |
|    | 16    | 16    | 16    |
| 20 | 4     | 4     | 52    |
|    | 8     | 8     | 44    |
|    | 16    | 16    | 28    |
|    | 20    | 20    | 20    |
| 24 | 4     | 4     | 64    |
|    | 8     | 8     | 56    |
|    | 16    | 16    | 40    |
|    | 20    | 20    | 32    |
| 28 | 4     | 4     | 76    |
|    | 8     | 8     | 66    |
|    | 16    | 16    | 52    |
|    | 20    | 20    | 44    |
|    | 28    | 28    | 28    |
| 32 | 4     | 4     | 88    |
|    | 8     | 8     | 80    |
|    | 16    | 16    | 64    |
|    | 20    | 20    | 56    |
|    | 28    | 28    | 40    |

It can be seen from the table that the case where $d_1=d_2=d_3$ occurs only when the number of nozzles, and hence $n_1$, is not a multiple of three.

4. ELECTRONIC DEVICE

Devices for which the printing method described herein can be used include organic electronic devices. The term "organic electronic device" or sometimes just "electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In such devices, an organic active layer is sandwiched between two electrical contact layers. One Example of an organic electronic device structure is an OLED. The device has a first electrical contact layer, which is an anode layer, and a second electrical contact layer, which is a cathode layer. At least one of the electrical contact layers is light-transmitting so that light can pass through the electrical contact layer. A photoactive layer is between them. Additional layers may optionally be present. Adjacent to the anode may be a buffer layer. Adjacent to the buffer layer may be a hole transport layer, comprising hole transport material. Adjacent to the cathode may be an electron transport layer, comprising an electron transport material. As an option, devices may use one or more additional hole injection or hole transport layers next to the anode and/or one or more additional electron injection or electron transport layers next to the cathode.

It is well known to use organic electroluminescent compounds as the active component in such devices to provide the necessary colors. The printing method described herein is suitable for the printing of liquid compositions containing electroluminescent materials having different colors. Such materials include, but are not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 20041016710, and organometallic complexes described in, for Example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly (spirobifluorenes), polythiophenes, poly(p-phenylenes), copolymers thereof, and mixtures thereof.

To form the printing inks, the above materials are dissolved or dispersed in a suitable liquid composition. A suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, comprising the new compounds, includes, but is not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), keytones (cyclopentatone) and mixtures thereof. Suitable solvents for photoactive materials have been described in, for Example, published POT application WO 2007/145979.

EXAMPLES

The concepts described herein will be further described in the following examples and associated figures, which do not limit the scope of the invention described in the claims.

Example 1

Example 1 is illustrated in FIG. 3. The four colors are illustrated as M1, M2, M3 and M4, and all of the colors are printed. There are 8 nozzles on the printing head, and the spacing between nozzles is 3 units of subpixel pitch. Thus, in this example, q=4, r=0, z=8 and $n_1$=2.

The colors are arranged as shown under the column labeled "Printer." The printing head is positioned at the first edge with the first nozzle, having color M1, over subpixel row 1. This is the first printing position shown as A1. The position A1 is defined as the subpixel row over which the first nozzle is placed. The printer prints across the workpiece in the row direction to form a row of M1 color in subpixel row 1, a row of M2 color in subpixel row 4, a row of M3 color in subpixel row 7, a row of M4 in subpixel row 10, a row of M1 color in subpixel row 13, a row of M2 color in subpixel row 16, a row of M3 color in subpixel row 19, and a row of M4 color in subpixel row 22. This is shown in the column labeled Print #1. Only one subpixel is shown for each color for purposes of clarity, but each represents an entire row of subpixels.

In this example, the printing patterns are carried out in order (i): the first printing pattern, followed by the second printing pattern, followed by the third printing pattern. Thus, the next step is to form the first printing pattern, step (5). The printer shifts laterally by a distance $d_1$ which is $4n_2$ subpixel units. In this case $n_2=1$ and $d_1=4s$. This is position A2 for the printer. The printer then prints another set of rows: a row of M1 color in subpixel row 5, a row of M2 color in subpixel row 8, a row of M3 color in subpixel row 11, a row of M4 in subpixel row 14, a row of M1 color in subpixel row 17, a row of M2 color in subpixel row 20, a row of M3 color in subpixel row 23, and a row of M4 color in subpixel row 26, as shown in the column labeled Print #2. Print #2 is shown shifted to the right of Print #1 for purposes of clarity. Both Print #1 and Print #2, as well as all the other Print numbers, represent full rows of printed subpixels across the workpiece. This completes the first printing pattern.

The next step is to form the second printing pattern, step (6). The printer shifts laterally by $d_2$ subpixel units, where $d_2$ is equal to $d_1$. This is position A3 for the printer. The printer then prints a third set of rows: a row of M1 color in subpixel row 9, a row of M2 color in subpixel row 12, a row of M3 color in subpixel row 15, a row of M4 in subpixel row 18, a row of M1 color in subpixel row 21, a row of M2 color in subpixel row 24, a row of M3 color in subpixel row 27, and a row of M4 color in subpixel row 30, as shown in the column labeled Print #3. This completes the second printing pattern.

The next step is to form the third printing pattern, step (7). The printer shifts laterally by $d_3$ subpixel units, where $d_3$ is equal to $pz-2d_1$. In this case, $p=3s$, $z=8$, and $d_1=4s$, so that $d_3=3s \cdot 8 - 2 \cdot 4s = 16s$. This is position A4 for the printer. The printer then prints a third set of rows: a row of M1 color in subpixel row 25, a row of M2 color in subpixel row 28, a row of M3 color in subpixel row 31, a row of M4 in subpixel row 34, a row of M1 color in subpixel row 37, a row of M2 color in subpixel row 40, a row of M3 color in subpixel row 43, and a row of M4 color in subpixel row 46, as shown in the column labeled Print #4. This completes the third printing pattern.

The next step, step (8), is to repeat steps (5) through (7) in the same order. To repeat step (5), the printer shifts laterally by a distance $d_1=4s$. This is position A5 for the printer. The printer then prints another set of rows: a row of M1 color in subpixel row 29, a row of M2 color in subpixel row 32, a row of M3 color in subpixel row 35, a row of M4 in subpixel row 38, a row of M1 color in subpixel row 41, a row of M2 color in subpixel row 44, a row of M3 color in subpixel row 47, and a row of M4 color in subpixel row 50, as shown in the column labeled Print #5.

To repeat step (6), the printer shifts laterally by a distance $d_2=d_1=4s$. This is position A6 for the printer. The printer then prints another set of rows: a row of M1 color in subpixel row 33, a row of M2 color in subpixel row 36, a row of M3 color in subpixel row 39, a row of M4 in subpixel row 42, a row of M1 color in subpixel row 45, a row of M2 color in subpixel row 48, a row of M3 color in subpixel row 51, and a row of M4 color in subpixel row 54, as shown in the column labeled Print #6.

To repeat step (7), the printer shifts laterally by a distance $d_3=16s$. This is position A7 for the printer. The printer then prints another set of rows: a row of M1 color in subpixel row 49, a row of M2 color in subpixel row 52, a row of M3 color in subpixel row 55, a row of M4 in subpixel row 58, a row of M1 color in subpixel row 61, a row of M2 color in subpixel row 64, a row of M3 color in subpixel row 67, and a row of M4 color in subpixel row 70, as shown in the column labeled Print #7.

At this point, the printer has printed seven sets of eight rows of subpixels, which is equal to 54 subpixel rows. At this time the printing has reached the opposite edge of the workpiece and printing is complete. In practice, most devices will require many more rows, up to hundreds of subpixel rows and more, and these rows will be printed in an analogous manner. The 54 subpixel rows in the figure are shown only as an illustration.

The printed outcome is shown in the column labeled "Pattern". It can be seen that subpixel rows 2, 3, and 6 at the first edge and subpixel rows 53, 56, 57, 59, 60, 62, 63, 65, 66, 68, and 69 at the opposite edge have no color. Complete sets of four subpixels are present from subpixel row 7 to subpixel row 50.

Example 2

Example 2 is illustrated in FIG. 4. The four colors are illustrated as M1, M2, M3 and M4, and all of the colors are printed. There are 8 nozzles on the printing head, and the spacing between nozzles is 3 units of subpixel pitch. Thus, as in Example 1, $q=4$, $r=0$, $z=8$ and $n_1=2$.

The colors are arranged as shown under the column labeled "Printer." The printing head is positioned at the first edge with the first nozzle, having M1, over subpixel row 1. This is the first printing position shown as A1. The printer prints across the workpiece in the row direction to form a row of M1 color in subpixel row 1, a row of M2 color in subpixel row 4, a row of M3 color in subpixel row 7, a row of M4 in subpixel row 10, a row of M1 color in subpixel row 13, a row of M2 color in subpixel row 16, a row of M3 color in subpixel row 19, and a row of M4 color in subpixel row 22. This is shown in the column labeled Print #1. Only one subpixel is shown for each color for purposes of clarity, but each represents an entire row of subpixels.

In this example, the printing patterns are carried out in order (ii): the third printing pattern, followed by the first printing pattern, followed by the second printing pattern. Thus, the next step in this Example is to position the printer to form the third printing pattern, step (7). In Example 1, the printer first shifted by a distance of d. In the Example for FIG. 4, the printer first shifts laterally by a distance where $d_3$ is equal to $pz-2d_1$. In this case, $n_2=1$ and $d_1=4s$. Thus, as in Example 1, $d_3=3s \cdot 8-2 \cdot 4s=16s$. This is position A2 for the printer. The printer then prints another set of rows: a row of M1 color in subpixel row 17, a row of M2 color in subpixel row 20, a row of M3 color in subpixel row 23, a row of M4 in subpixel row 26, a row of M1 color in subpixel row 29, a row of M2 color in subpixel row 32, a row of M3 color in subpixel row 35, and a row of M4 color in subpixel row 38, as shown in the column labeled Print #2. Print #2 is shown shifted to the right of Print #1 for purposes of clarity. Both Print #1 and Print #2, as well as all the other Print numbers, represent full rows of printed subpixels across the workpiece. This completes the third printing pattern.

The next step is to form the first printing pattern, step (5). The printer shifts laterally by $d_1$ subpixel units, where $n_2=1$ and $d_1=4s$. This is position A3 for the printer. The printer then prints a third set of rows: a row of M1 color in subpixel row 21, a row of M2 color in subpixel row 24, a row of M3 color in subpixel row 27, a row of M4 in subpixel row 30, a row of M1 color in subpixel row 33, a row of M2 color in subpixel row 36, a row of M3 color in subpixel row 39, and a row of M4 color in subpixel row 42, as shown in the column labeled Print #3. This completes the first printing pattern.

The next step is to form the second printing pattern, step (6). The printer shifts laterally by $d_2$ subpixel units, where $d_2=d_1=4s$. This is position A4 for the printer. The printer then prints a third set of rows: a row of M1 color in subpixel row 25, a row of M2 color in subpixel row 28, a row of M3 color in subpixel row 31, a row of M4 in subpixel row 34, a row of M1 color in subpixel row 37, a row of M2 color in subpixel row 40, a row of M3 color in subpixel row 43, and a row of M4 color in subpixel row 46, as shown in the column labeled Print #4. This completes the third printing pattern.

The next step, step (8), is to repeat steps (7), (5), and (6) in the same order. To repeat step (7), the printer shifts laterally by a distance $d_3=16s$. This is position A5 for the printer. The printer then prints another set of rows: rows of M1 color in subpixel rows 41 and 53; rows of M2 color in subpixel rows 44 and 56; rows of M3 color in subpixel rows 47 and 59; and rows of M4 color in subpixel rows 50 and 62, as shown in the column labeled Print #5.

To repeat step (5), the printer shifts laterally by a distance $d_1=4s$. This is position A6 for the printer. The printer then prints another set of rows: rows of M1 color in subpixel rows 45 and 57; rows of M2 color in subpixel rows 48 and 60; rows of M3 color in subpixel rows 51 and 63; and rows of M4 color in subpixel rows 54 and 66, as shown in the column labeled Print #6.

To repeat step (6), the printer shifts laterally by a distance $d_2=d_1=4s$. This is position A7 for the printer. The printer then prints another set of rows; rows of M1 color in subpixel rows 49 and 61; rows of M2 color in subpixel rows 52 and 64; rows of M3 color in subpixel rows 55 and 67; and rows of M4 color in subpixel rows 58 and 70, as shown in the column labeled Print #7.

At this point, the printer has printed seven sets of eight rows of subpixels, which is equal to 54 subpixel rows. As discussed above, most devices will require many more rows, up to hundreds of subpixel rows and more, and the 54 subpixel rows in the figure are shown only as an illustration.

The printed outcome is shown in the column labeled "Pattern". It can be seen that subpixel rows 2, 3, 5, 6, 8, 9, 11, 12, 14, 15, and 18 at the first edge and subpixel rows 65, 68 and 69 at the opposite edge have no color. Complete sets of four subpixels are present from subpixel row 19 to subpixel row 62. In comparing FIGS. 3 and 4, it can be seen that there are many more subpixels having no color at the leading edge in FIG. 4, with the printing scheme of Example 2. There are more subpixels having no color at the opposite edge in FIG. 3, with the printing scheme of Example 1. In some embodiments, the printing pattern order of Example 1 will be used, but ended after a repeat of step (5) or step (6). The choice of printing scheme will generally depend on the device design.

Example 3

Example 3 is illustrated in FIG. 5. The four colors are illustrated as M1, M2, M3 and M4, and all of the colors are printed. As in Examples 1 and 2, there are 8 nozzles on the printing head, and the spacing between nozzles is 3 units of subpixel pitch. Thus, $q=4$, $r=0$, $z=8$ and $n_1=$ The colors are arranged as shown under the column labeled "Printer." The printing head is positioned at the first edge with the first nozzle, having M1, over subpixel row 1. This is the first printing position shown as A1. The printer prints across the workpiece in the row direction to form a row of M1 color in subpixel row 1, a row of M2 color in subpixel row 4, a row of M3 color in subpixel row 7, a row of M4 in subpixel row 10, a row of M1 color in subpixel row 13, a row of M2 color in subpixel row 16, a row of M3 color in subpixel row 19, and a row of M4 color in subpixel row 22. This is shown in the column labeled Print #1. Only one subpixel is shown for each color for purposes of clarity, but each represents an entire row of subpixels.

In this example, the printing patterns are carried out in order (i): the first printing pattern, followed by the second printing pattern, followed by the third printing pattern. Thus, the next step is to form the first printing pattern. The printer shifts laterally by a distance $d_1$ which is $4n_2$ subpixel units. In this case $n_2=2$ and $d_1=8s$. This is position A2 for the printer. The printer then prints another set of rows: rows of M1 color in subpixel rows 9 and 21; rows of M2 color in subpixel rows 12 and 24; rows of M3 color in subpixel rows 15 and 27; and rows of M4 color in subpixel rows 18 and 30, as shown in the column labeled Print #2. Print #2 is shown shifted to the right of Print #1 for purposes of clarity. Both Print #1 and Print #2, as well as all the other Print numbers, represent full rows of printed subpixels across the workpiece. This completes the first printing pattern.

The next step is to form the second printing pattern. The printer shifts laterally by $d_2$ subpixel units, where $d_2$ is equal to $d_1=8s$. This is position A3 for the printer. The printer then prints a third set of rows: rows of M1 color in subpixel rows 17 and 29; rows of M2 color in subpixel rows 20 and 32; rows of M3 color in subpixel rows 23 and 35; and rows of M4 color in subpixel rows 26 and 38, as shown in the column labeled Print #3. This completes the second printing pattern.

The next step is to form the third printing pattern. The printer shifts laterally by $d_3$ subpixel units, where $d_3$ is equal to $pz-2d_1$. In this case, $p=3s$, $z=8$, and $d_1=8s$, so that $d_3=3s\cdot 8-2\cdot 8s=8s$. Thus, in this example, $d_1=d_2=d_3$, and all lateral shifts will be of 8s. This is position A4 for the printer. The printer then prints a third set of rows: rows of M1 color in subpixel rows 25 and 37; rows of M2 color in subpixel rows 28 and 40; rows of M3 color in subpixel rows 31 and 43; and rows of M4 color in subpixel rows 34 and 46, as shown in the column labeled Print #4. This completes the third printing pattern.

At this point, the printer has printed four sets of eight rows of subpixels, which is equal to 32 subpixel rows. As discussed above, most devices will require many more rows, up to hundreds of subpixel rows and more, and the 32 subpixel rows in the figure are shown only as an illustration.

The printed outcome is shown in the column labeled "Pattern". It can be seen that subpixel rows 2, 3, 5, 6, 8, 11, and 14 at the first edge and subpixel rows 33, 36, 39, 41, 42, 44, and 45 at the opposite edge have no color. Complete sets of four subpixels are present from subpixel row 15 to subpixel row 30.

Example 4

Example 4 is illustrated in FIG. 6. The four colors are illustrated as M1, M2, M3 and M4, and all of the colors are printed. There are 12 nozzles on the printing head, and the spacing between nozzles is 3 units of subpixel pitch. Thus, $q=4$, $r=0$, $z=12$ and $n_1=3$.

The colors are arranged as shown under the column labeled "Printer." The printing head is positioned at the first edge with the first nozzle, having color M1, over subpixel row 1. This is the first printing position shown as A1. The printer prints across the workpiece in the row direction to form rows of M1 color in subpixel rows 1, 13, and 25; rows of M2 color in subpixel rows 4, 16, and 28; rows of M3 color in subpixel rows 7, 19, and 31; and rows of M4 color in subpixel rows 10, 22, and 34. This is shown in the column labeled Print #1. Only one subpixel is shown for each color for purposes of clarity, but each represents an entire row of subpixels.

In this example, the printing patterns are carried out in order (i): the first printing pattern, followed by the second printing pattern, followed by the third printing pattern. Thus, the next step is to form the first printing pattern. The printer shifts laterally by a distance $d_1$ which is $4n_2$ subpixel units. In this case $n_2=1$ and $d_1=4s$. This is position A2 for the printer. The printer then prints another set of rows: rows of M1 color in subpixel rows 5, 17, and 29; rows of M2 color in subpixel rows 8, 20, and 32; rows of M3 color in subpixel rows 11, 23, and 35; and rows of M4 color in subpixel rows 14, 26, and 38, as shown in the column labeled Print #2. Print #2 is shown shifted to the right of Print #1 for purposes of clarity. Both Print #1 and Print #2, as well as all the other Print numbers, represent full rows of printed subpixels across the workpiece. This completes the first printing pattern.

The next step is to form the second printing pattern. The printer shifts laterally by $d_2$ subpixel units, where $d_2$ is equal to $d_1$ and is 4s. This is position A3 for the printer. The printer then prints another set of rows: rows of M1 color in subpixel rows 9, 21, and 33; rows of M2 color in subpixel rows 12, 24, and 36; rows of M3 color in subpixel rows 15, 27, and 39; and rows of M4 color in subpixel rows 18, 30, and 42 as shown in the column labeled Print #3.

The next step is to form the third printing pattern. The printer shifts laterally by $d_3$ subpixel units, where $d_3$ is equal to $pz-2d_1$. In this case, $p=3s$, $z=12$, and $d_1=4s$, so that $d_3=3s \cdot 12 - 2 \cdot 4s = 28s$. This is position A4 for the printer. The printer then prints a third set of rows: rows of M1 color in subpixel rows 37, 49, and 61; rows of M2 color in subpixel rows 40, 52, and 64; rows of M3 color in subpixel rows 43, 55, and 67; and rows of M4 color in subpixel rows 46, 58, and 70, as shown in the column labeled Print #4.

The next step is to repeat the first printing pattern. The printer shifts laterally by a distance $d_1=4s$. This is position A5 for the printer. The printer then prints a third set of rows: rows of M1 color in subpixel rows 41, 53, and 65; rows of M2 color in subpixel rows 44, 56, and 68; rows of M3 color in subpixel rows 47, 59, and 71; and rows of M4 color in subpixel rows 50, 62, and 74, as shown in the column labeled Print #5.

The next step is to repeat the second printing pattern. The printer shifts laterally by a distance $d_2=d_1=4s$. This is position A6 for the printer. The printer then prints a third set of rows: rows of M1 color in subpixel rows 45, 57, and 69; rows of M2 color in subpixel rows 48, 60, and 72; rows of M3 color in subpixel rows 51, 63, and 75; and rows of M4 color in subpixel rows 54, 66, and 78, as shown in the column labeled Print #6.

At this point, the printer has printed six sets of 12 rows of subpixels, which is equal to 72 subpixel rows. As discussed above, most devices will require many more rows, up to hundreds of subpixel rows and more, and the 72 subpixel rows in the figure are shown only as an illustration.

The printed outcome is shown in the column labeled "Pattern". It can be seen that subpixel rows 2, 3, and 6 at the first edge and subpixel rows 73, 76, and 77 at the opposite edge have no color. Complete sets of four subpixels are present from subpixel row 7 to subpixel row 70.

Example 5

Example 7 is illustrated in FIG. 7. The four colors are illustrated as M1, M2, M3 and M4, and all of the colors are printed. There are 12 nozzles on the printing head, and the spacing between nozzles is 3 units of subpixel pitch. Thus, $q=4$, $r=0$, $z=12$ and $n_1=3$.

The colors are arranged as shown under the column labeled "Printer." The printing head is positioned at the first edge with the first nozzle, having color M1, over subpixel row 1. This is the first printing position shown as A1. The printer prints across the workpiece in the row direction to form rows of M1 color in subpixel rows 1, 13, and 25; rows of M2 color in subpixel rows 4, 16, and 28; rows of M3 color in subpixel rows 7, 19, and 31; and rows of M4 color in subpixel rows 10, 22, and 34. This is shown in the column labeled Print #1. Only one subpixel is shown for each color for purposes of clarity, but each represents an entire row of subpixels.

In this example, the printing patterns are carried out in order (0: the first printing pattern, followed by the second printing pattern, followed by the third printing pattern. Thus, the next step is to form the first printing pattern. The printer shifts laterally by a distance $d_1$ which is $4n_2$ subpixel units. In this case $n_2=2$ and $d_1=8s$. This is position A2 for the printer. The printer then prints another set of rows: rows of M1 color in subpixel rows 9, 21, and 33; rows of M2 color in subpixel rows 12, 24, and 36; rows of M3 color in subpixel rows 15, 27, and 39; and rows of M4 color in subpixel rows 18, 30, and 42, as shown in the column labeled Print #2. Print #2 is shown shifted to the right of Print #1 for purposes of clarity. Both Print #1 and Print #2, as well as all the other Print numbers, represent full rows of printed subpixels across the workpiece. This completes the first printing pattern.

The next step is to form the second printing pattern. The printer shifts laterally by $d_2$ subpixel units, where $d_2$ is equal to $d_1$ and is 8s. This is position A3 for the printer. The printer then prints another set of rows: rows of M1 color in subpixel rows 17, 29, and 41; rows of M2 color in subpixel rows 20, 32, and 44; rows of M3 color in subpixel rows 23, 35, and 47; and rows of M4 color in subpixel rows 26, 38, and 50 as shown in the column labeled Print #3.

The next step is to form the third printing pattern. The printer shifts laterally by $d_3$ subpixel units, where $d_3$ is equal to $pz-2d_1$. In this case, $p=3s$, $z=12$, and $d_1=8s$, so that $d_3=3s \cdot 12 - 2 \cdot 8s = 20s$. This is position A4 for the printer. The printer then prints a third set of rows: rows of M1 color in subpixel rows 37, 49, and 61; rows of M2 color in subpixel rows 40, 52, and 64; rows of M3 color in subpixel rows 43, 55, and 67; and rows of M4 color in subpixel rows 46, 58, and 70, as shown in the column labeled Print #4.

The next step is to repeat the first printing pattern. The printer shifts laterally by a distance $d_1=8s$. This is position A5 for the printer. The printer then prints a third set of rows: rows of M1 color in subpixel rows 45, 57, and 69; rows of M2 color in subpixel rows 48, 60, and 72; rows of M3 color in subpixel rows 51, 63, and 75; and rows of M4 color in subpixel rows 54, 66, and 78, as shown in the column labeled Print #5.

The next step is to repeat the second printing pattern. The printer shifts laterally by a distance $d_2=d_1=8s$. This is position A6 for the printer. The printer then prints a third set of rows: rows of M1 color in subpixel rows 53, 65, and 77; rows of M2 color in subpixel rows 56, 68, and 80; rows of M3 color in subpixel rows 59, 71, and 83; and rows of M4 color in subpixel rows 62, 74, and 86, as shown in the column labeled Print #6.

The printing is then stopped without repeating the third printing pattern. At this point, the printer has printed six sets of 12 rows of subpixels, which is equal to 72 subpixel rows. As discussed above, most devices will require many more rows, up to hundreds of subpixel rows and more, and the 72 subpixel rows in the figure are shown only as an illustration.

The printed outcome is shown in the column labeled "Pattern". R can be seen that subpixel rows 2, 3, 5, 6, 8, 11, and 14 at the first edge and subpixel rows 73, 76, 79, 81, 82, 84, and 85 at the opposite edge have no color. Complete sets of four subpixels are present from subpixel row 15 to subpixel row 70.

Example 6

Example 6 is illustrated in FIG. 8. In this example, not all the colors are printed. One color is deposited using a non-printing deposition method. In this example, the printing leaves open spaces for the non-printed color, which is applied after the printing step. For the purposes of the printing pattern, an open space is counted as a color.

As shown in FIG. 8, there are three colors, M1, M2, and M3, and an open space for a fourth color to be deposited by a non-printing method, shown as "blank" in the figure. This is counted as four colors: M1, M2, M3, and blank. There are two nozzles printing M1, two nozzles printing M2, two nozzles printing M3, and two nozzles that are not printing. The non-printing nozzles may or may not be physically present on the printing head. If the non-printing nozzles are not present, there is a space for them and the space is counted as a nozzle for the purposed of the printing pattern. Thus, this is counted as a total of eight nozzles. The different liquid compositions, one for each color and the lack of one for the open space, are supplied in a regular alternating pattern. The spacing between nozzles (printing nozzles and non-printing nozzles) is three units of subpixel pitch. Thus, in this example: $q=3$, $r=1$, $z=8$ and $n_1=2$.

The colors are arranged as shown in the "Printer" column, where "blank" indicates a non-printing nozzle. The printing head is positioned at the first edge with the first nozzle, having M1, over subpixel row 1. This is the first printing position shown as A1. The printer prints across the workpiece in the row direction to form a row of M1 color in subpixel row 1, a row of M2 color in subpixel row 4, a row of no color in subpixel row 7, a row of M3 in subpixel row 10, a row of M1 color in subpixel row 13, a row of M2 color in subpixel row 16, a row of no color in subpixel row 19, and a row of M3 color in subpixel row 22. This is shown in the column labeled Print #1. Only one subpixel is shown for each color for purposes of clarity, but each represents an entire row of subpixels.

In this example, the printing patterns are carried out in order (i): the first printing pattern, followed by the second printing pattern, followed by the third printing pattern. Thus, the next step is to form the first printing pattern. The printer shifts laterally by a distance $d_1$ which is $4n_2$ subpixel units. In this case $n_2=1$ and $d_1=4s$. This is position A2 for the printer. The printer then prints another set of rows: a row of M1 color in subpixel row 5, a row of M2 color in subpixel row 8, a row of no color in subpixel row 11, a row of M3 in subpixel row 14, a row of M1 color in subpixel row 17, a row of M2 color in subpixel row 20, a row of no color in subpixel row 23, and a row of M3 color in subpixel row 26, as shown in the column labeled Print #2. Print #2 is shown shifted to the right of Print #1 for purposes of clarity. Both Print #1 and Print #2, as well as all the other Print numbers, represent full rows of printed subpixels across the workpiece. This completes the first printing pattern.

The next step is to form the second printing pattern. The printer shifts laterally by $d_2$ subpixel units, where $d_2$ is equal to $=4s$. This is position A3 for the printer. The printer then prints a third set of rows: a row of M1 color in subpixel row 9, a row of M2 color in subpixel row 12, a row of no color in subpixel row 15, a row of M3 in subpixel row 18, a row of M1 color in subpixel row 21, a row of M2 color in subpixel row 24, a row of no color in subpixel row 27, and a row of M3 color in subpixel row 30, as shown in the column labeled Print #3. This completes the second printing pattern.

The next step is to form the third printing pattern. The printer shifts laterally by $d_3$ subpixel units, where $d_3$ is equal to $pz-2d_1$. In this case, $p=3s$, $z=8$, and $d_1=4s$, so that $d_3=3s\cdot 8-2\cdot 4s=16s$. This is position A4 for the printer. The printer then prints a third set of rows: a row of M1 color in subpixel row 25, a row of M2 color in subpixel row 28, a row of no color in subpixel row 31, a row of M3 in subpixel row 34, a row of M1 color in subpixel row 37, a row of M2 color in subpixel row 40, a row of no color in subpixel row 43, and a row of M3 color in subpixel row 46, as shown in the column labeled Print #4. This completes the third printing pattern.

The next step is to repeat the first printing pattern. The printer shifts laterally by a distance $d_1=4s$. This is position A5 for the printer. The printer then prints another set of rows: a row of M1 color in subpixel row 29, a row of M2 color in subpixel row 32, a row of no color in subpixel row 35, a row of M3 in subpixel row 38, a row of M1 color in subpixel row 41, a row of M2 color in subpixel row 44, a row of no color in subpixel row 47, and a row of M3 color in subpixel row 50, as shown in the column labeled Print #5.

The next step is to repeat the second printing pattern. The printer shifts laterally by a distance $d_2=d_1=4s$. This is position A6 for the printer. The printer then prints another set of rows: a row of M1 color in subpixel row 33, a row of M2 color in subpixel row 36, a row of no color in subpixel row 39, a row of M3 in subpixel row 42, a row of M1 color in subpixel row 45, a row of M2 color in subpixel row 48, a row of no color in subpixel row 51, and a row of M3 color in subpixel row 54, as shown in the column labeled Print #5.

The printing is then stopped without repeating the third printing pattern. At this point, the printer has printed six sets of eight rows of subpixels, which is equal to 48 subpixel rows. As discussed above, most devices will require many more rows, up to hundreds of subpixel rows and more, and the 48 subpixel rows in the figure are shown only as an illustration.

The printed outcome is shown in the column labeled "Pattern". It can be seen that there are open subpixels that are available for a third color in the non-printing rows: subpixel rows 7, 11, 19, 23, etc. Complete sets of the two colors plus blank space for the third color, and thus the usable device area, can be found from subpixel row 7 to subpixel row 46.

The next step in the process is to apply the third color, M4, by a non-printing process. In some embodiments, the non-printing process is vapor deposition. In some embodiments, M1, M2, and M3 are red, green, and blue, respectively, and M4 is white.

Note that not all of the activities described above in the general description or the examples in the figures are required, that a portion of a specific activity may not be required, and that one or more further activities may be performed in addition to those described, Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A process of forming a regular array of rows of subpixels on a workpiece, the subpixels having four different colors, and having a subpixel pitch s, and wherein q colors are formed by printing and r colors are formed by a non-printing method, said process comprising:
    (1) providing a printing head having z nozzles arranged in a row with a spacing between the nozzles of p, where $z=4n_1$ and $p=3s$, the printing head being at a first position relative to the workpiece;
    (2) providing q different color printing inks to the printing head, one color printing ink for each of the q printed colors;
    (3) supplying each nozzle on the printing head with color printing ink in an alternating pattern, wherein adjacent nozzles on the printing head are not supplied the same color;
    (4) dispensing said color printing ink from the z nozzles to print
    (5) moving and printing in a first printing pattern comprising:
        (a) moving the workpiece laterally relative to the printing head by a distance $d_1$, where $d_1=4n_2s$;
        (b) printing a set of z rows of subpixels with the printing head;
    (6) moving and printing in a second printing pattern comprising:
        (c) moving the workpiece laterally relative to the printing head by a distance $d_2$, where $d_2=d_1$;
        (d) printing a set of z rows of subpixels with the printing head;
    (7) moving and printing in a third printing pattern comprising:
        (e) moving the workpiece laterally relative to the printing head by a distance $d_3$, where $d_3=4n_3s$, such that $d_1+d_2+d_3=pz$; and
        (f) printing a set of z rows of subpixels with the printing head;
    (8) repeating steps (5) through (7) multiple times in the same order; and
    (9) applying r colors by a non-printing method;
where:
    $n_1$ is an integer greater than 0;
    $n_2$ is an integer greater than 0, such that the integer is not a multiple of three and $n_2 \leq n_1$;
    $n_3$ is an integer such that $2n_2+n_3=3n_1$;
    q is an integer from 1-4; and
    r is an integer, such that $q+r=4$;
and wherein the patterns are carried out in the order (i) first printing pattern, followed by second printing pattern, followed by third printing pattern, or (ii) third printing pattern, followed by first printing pattern, followed by second printing pattern.

2. The process of claim 1, wherein q=4.

3. The process of claim 1, wherein $n_1$ is at least 2.

4. The process of claim 1, wherein $n_1=$3-9.

5. The process of claim 1, wherein $n_1$ is not a multiple of 3 and $d_1=d_2=d_3$.

6. The process of claim 1, wherein each printing ink comprises an electroluminescent material and a liquid medium.

7. The process of claim 1, wherein r is at least one and the non-printing method is selected from the group consisting of vapor deposition, thermal transfer, spin coating, gravure coating, curtain coating, dip coating, slot-die coating, and spray coating.

* * * * *